(12) United States Patent
Khu et al.

(10) Patent No.: US 7,047,352 B1
(45) Date of Patent: May 16, 2006

(54) FAIL-SAFE METHOD OF UPDATING A MULTIPLE FPGA CONFIGURATION DATA STORAGE SYSTEM

(75) Inventors: Arthur H. Khu, San Mateo, CA (US); Farshid Shokouhi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 374 days.

(21) Appl. No.: 10/230,920

(22) Filed: Aug. 28, 2002

(51) Int. Cl.
*G06F 12/00* (2006.01)

(52) U.S. Cl. .................. 711/103; 711/170; 713/100

(58) Field of Classification Search ............... 711/103, 711/205, 154, 170; 713/100, 400, 1; 326/38; 365/200; 370/467
See application file for complete search history.

(56) References Cited

U.S. PATENT DOCUMENTS

| | | | | | |
|---|---|---|---|---|---|
| 5,497,498 | A | * | 3/1996 | Taylor | 710/104 |
| 5,535,342 | A | * | 7/1996 | Taylor | 710/315 |
| 5,970,142 | A | * | 10/1999 | Erickson | 713/1 |
| 6,107,821 | A | * | 8/2000 | Kelem et al. | 326/38 |
| 6,477,643 | B1 | * | 11/2002 | Vorbach et al. | 713/100 |
| 6,606,670 | B1 | * | 8/2003 | Stoneking et al. | 710/14 |
| 6,621,353 | B1 | * | 9/2003 | Bronson et al. | 713/500 |
| 6,690,224 | B1 | * | 2/2004 | Moore | 327/296 |
| 6,697,979 | B1 | * | 2/2004 | Vorbach et al. | 714/724 |
| 6,829,250 | B1 | * | 12/2004 | Voit et al. | 370/467 |
| 2002/0172081 | A1 | * | 11/2002 | Mukaida et al. | 365/200 |
| 2004/0049672 | A1 | * | 3/2004 | Nollet et al. | 713/100 |

\* cited by examiner

*Primary Examiner*—Pierre-Michel Bataille
(74) *Attorney, Agent, or Firm*—Edel M. Young; LeRoy D. Maunu; Justin Liu

(57) ABSTRACT

Structure and method for updating a system that includes a memory and a programmable logic device (PLD) retains a default PLD configuration in the memory while a new configuration is being stored in the memory, and thus protect the system from failure in case an interruption occurs while the new configuration is being stored. If a power failure interrupts the storing process, the default PLD configuration is still in the memory and can be re-loaded into the PLD and used when the system is re-started to make a further attempt at storing the new configuration. Methods are also disclosed for storing in the memory a configuration for a new PLD before the original PLD is replaced so that system hardware can be updated with minimum effort and disruption, and for dividing a directory structure into protected and unprotected regions.

24 Claims, 5 Drawing Sheets

US 7,047,352 B1

FAIL-SAFE METHOD OF UPDATING A MULTIPLE FPGA CONFIGURATION DATA STORAGE SYSTEM

FIELD OF THE INVENTION

The present invention relates to memory management and to configuring and reconfiguring a programmable logic device such as an FPGA and to assuring that errors during reconfiguration of a memory that stores a configuration can be recovered from.

BACKGROUND

A system including a programmable logic device (PLD) such as an FPGA typically includes a nonvolatile memory for storing configuration data for the PLD. When the system is powered up, the configuration information in the nonvolatile memory is loaded into the PLD to configure it so the system can become operational. PLDs have the advantage that they can be reconfigured while in the system, thus allowing the system to take on a different function without having to change any of the hardware in the system. It is also possible to change the hardware in the system to add new features, increase speed, or otherwise upgrade the system, and this typically requires reconfiguring the PLD to implement the new features or to work with other new hardware. Systems including FPGAs or other PLDs need for the PLD to be configured in order to be fully functional. In certain instances, the PLD will need to be functional for a user to be able to store a new configuration in the nonvolatile memory that configures the PLD.

If the system experiences a power failure or other interruption such as brownout while a new configuration is being stored in the nonvolatile memory, the system can become unusable because there is no functional configuration stored in the nonvolatile memory. When power is restored, there will be no working configuration available to load into the PLD.

When computer firmware and programmable logic device configurations are updated, it is important that any error that occurs during the reconfiguration not leave the system in an unstable state or in a state that can not be recovered from.

To avoid this problem, the user had to use an uninterruptible power supply (UPS) or to ensure through other means that no interruptions occurred while updating.

It would be desirable to be able to assure that a failure while reconfiguring a PLD would not leave the system in an unusable state without requiring the use of an uninterruptible power supply.

SUMMARY OF THE INVENTION

According to the invention, a default configuration is stored in memory and is not disturbed when a new configuration or partial configuration is being stored in memory. The nonvolatile memory includes a directory with pointers to sections in memory capable of separately being updated. Once a default data stream is stored in the memory system, any further updates can be interruptible. If the memory supports sector write-protection, then the system can set the sectors containing the directory and the default configuration data as protected. If a further update is interrupted, then the system can reload or restart by using the default configuration data that was not changed during the update process. The system can then retry the update procedure until successful. Such a system does not require a UPS because the system can access the last successfully performed update.

As another aspect of the invention, when a user intends to upgrade a system by replacing a PLD with another PLD requiring a different bitstream, the invention includes a fail-safe method of using the original PLD while storing a new PLD configuration in the memory, then replacing the original PLD with the new PLD, then starting up the system and loading the new configuration into the new PLD.

DETAILED DESCRIPTION

Figure 1:
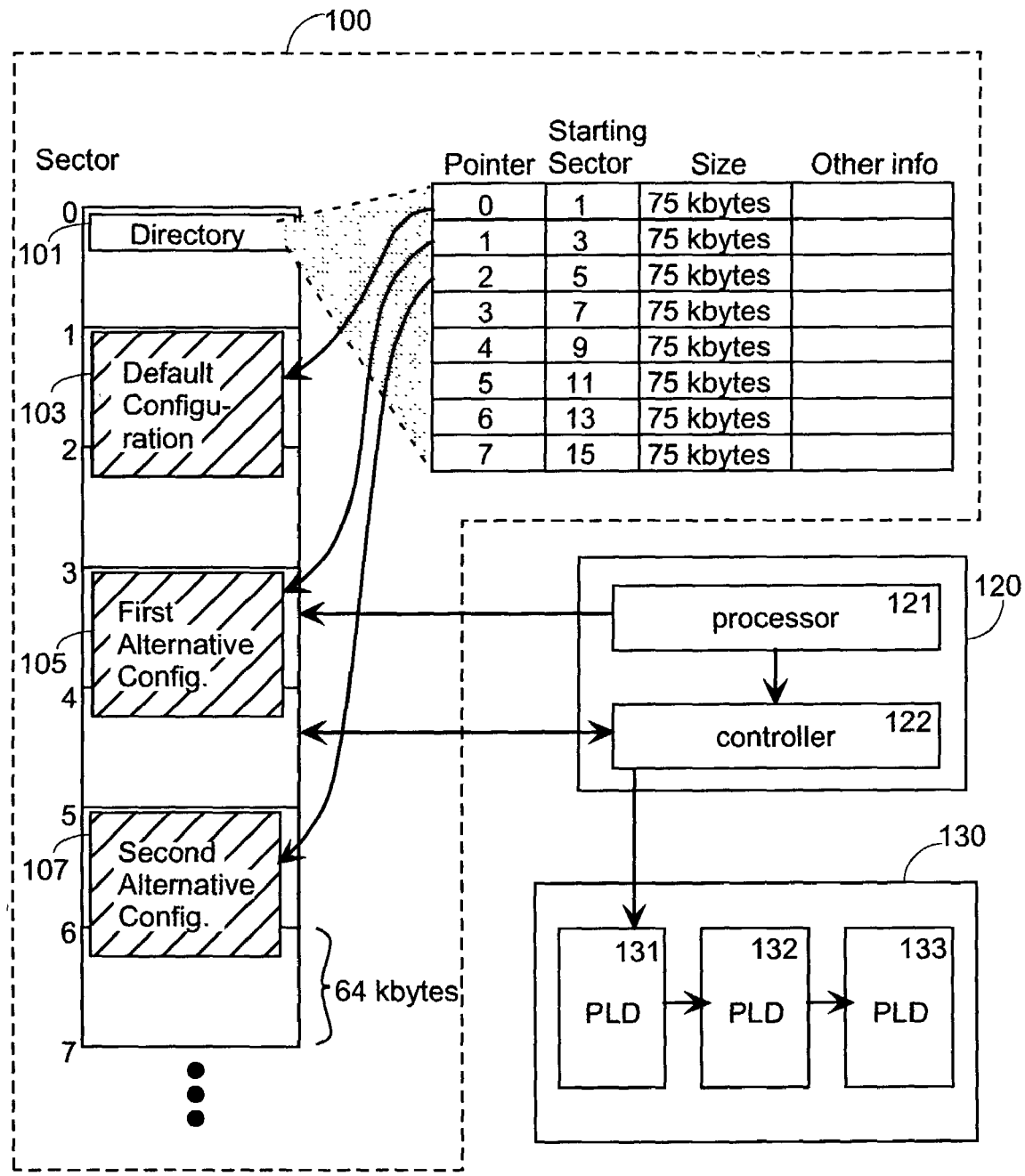
FIG. 1 shows a system that includes a processor, a controller, PLDs, and a memory structure according to the invention.

FIG. 1 shows a system that includes a memory structure 100 according to the invention. The system includes a processor 121, a controller 122, several PLDs 131, 132, and 133 on a board or card 130, and a memory 100 according to the invention. Memory 100 stores a default configuration, alternative configurations, and a directory structure for selecting one of the configurations. In the illustrated embodiment, the memory is divided into 64-kilobyte sectors, of which the first seven are shown. One configuration for a PLD of interest requires 75 kilobytes, and thus requires a bit more than one sector. In this embodiment, a directory has been stored in sector 0, a default configuration 103 has been stored in sector 1 and part of sector 2, a first alternative configuration has been stored in sectors 3 and 4, and further alternative configurations have been stored in subsequent pairs of sectors.

If the system will use the PLD to perform several alternative functions, several alternative configurations 105, 107, and possibly others not shown, are also stored in memory 100. In order for the system to become operational, it is necessary only that directory 101 and default configuration 103 be correctly stored.

If an error such as a power failure occurs while any alternative configuration is being stored or replaced, default configuration 103 is available, and can be accessed by causing directory 101 to select default configuration 103 for configuring the PLD. If no error occurs during storing alternative configurations in memory 100, and the alternative configurations are stored or replaced correctly, then the PLD can be reconfigured to implement one of these alternative configurations.

Also, if acceptable and correct alternative configurations are present in memory 100, processor 121 or controller 122 may instruct directory 101 in memory 100 to select one of the alternative configurations as a default configuration. Thus the next time the system is powered up, directory 101 selects the alternative configuration, and the PLD is configured with the new default (alternative) configuration.

Figure 2:
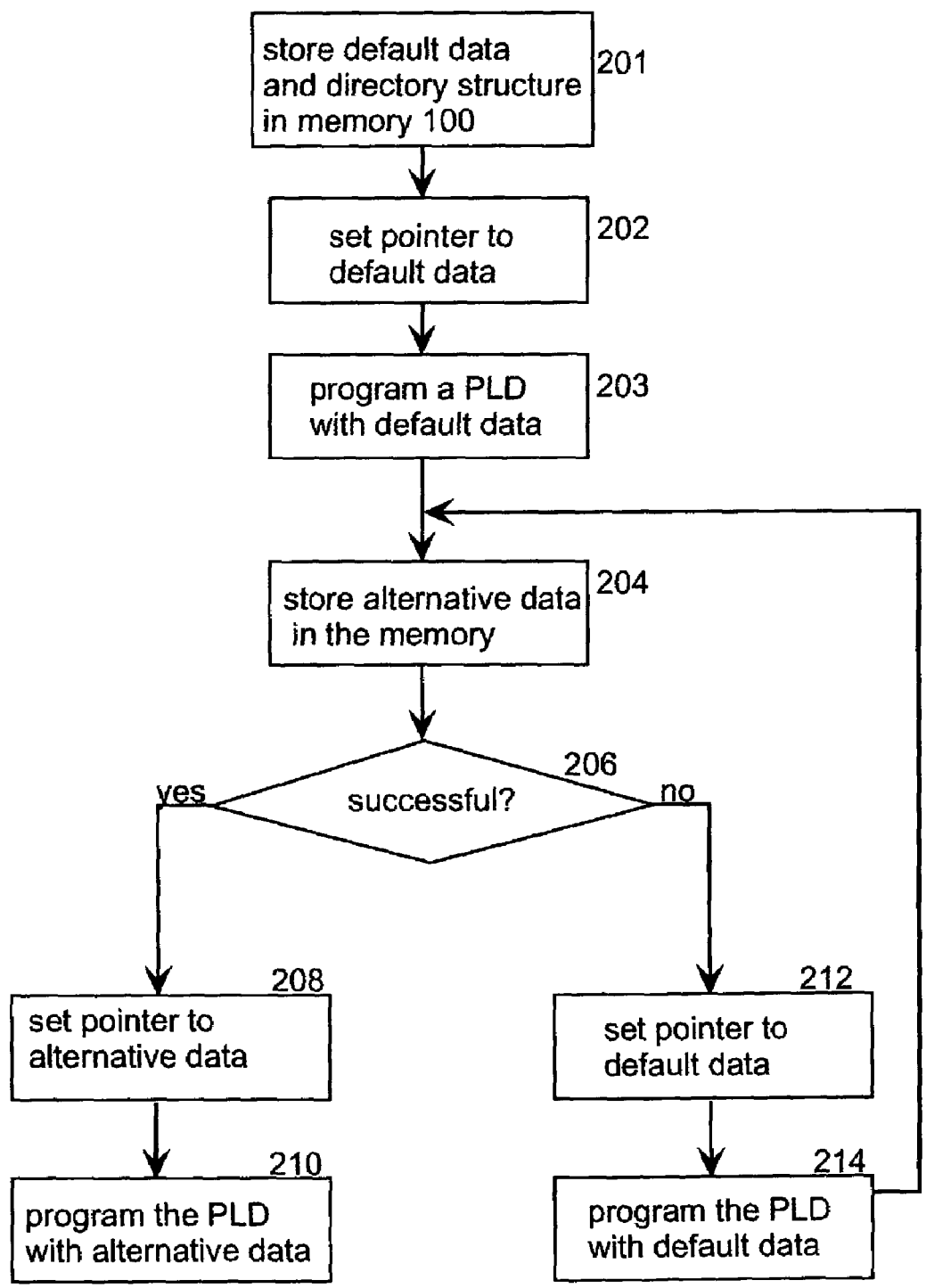
FIG. 2 shows a process according to the invention for updating a memory structure.

FIG. 2 shows a process for storing new configurations in memory 100 in a fail-safe manner, and using the new configurations. At step 201, default configuration data 103 and directory structure 101 are stored in a memory such as memory 100.

As shown in FIG. 1, directory structure 101 includes pointers to starting addresses of several alternative configurations. Eight alternative configurations are shown in FIG. 1. Since all configurations are for the same PLD, and the example PLD uses 75 kilobytes in its configuration bitstream, all alternative configurations require 75 kilobytes, and two sectors are reserved for each of these configurations. The directory 101 specifies the starting address and, optionally, the total size of the configuration bitstream. Step 201 (FIG. 2) may be performed before memory 100 is installed in the system, and is not protected by the fail-safe method of the invention, as are the later steps. Step 201 may include storing of alternative configurations as well, up to as many as can be stored in memory 100, or in a minimal case includes storing only the default configuration data 103 and the directory structure.

After step 201 is performed, the remaining steps are performed while memory 100 and the PLD are installed in the system, and these steps allow a fail-safe installation of alternative configurations into memory 100. In the embodiment of FIG. 1, directory 101 points to starting addresses of eight alternative sets of configuration data 0 through 7. Each set of configuration data has a starting address at the beginning of a sector. Since in this example, each set of configuration data occupies 75 kilobytes, the subsequent sets of configuration data begin at odd-numbered sector boundaries.

When the system is installed and started up, at step 202, processor 121 or controller 122 (FIG. 1) addresses the default location in directory 101, which causes directory 101 to point to the starting address of default configuration data 103. At step 203, the PLD(s) are then programmed with this default configuration data.

If it is decided by a user to store an alternative configuration in memory 100 for the purpose of reconfiguring the PLD(s), at step 204, processor 121 stores an alternative configuration in memory 100. But according to the invention, this alternative configuration is not overwritten onto default configuration 103. Instead the alternative configuration data stream is stored in one of the alternative configuration data locations such as 105 or 107. This may be accomplished by processor 121 writing the alternative configuration directly into a selected location in memory 100 or by processor 121 causing controller 122 to access an entry in directory 101, which in turn selects a starting address in memory 100, so that subsequent data received by controller 122 is written into memory starting from this address.

If the storing operation is determined at step 206 to be successful, at step 208, processor 121 instructs controller 122 to access an alternative pointer in directory 101, which causes directory 101 to select the alternative data so that at step 210, one or all of the PLDs 131, 132, 133 are programmed with this alternative data. However, if step 204 is somehow interrupted so that step 206 indicates the storing operation is not successful, the benefits of the invention occur at this point because at step 212 controller 122 causes directory 101 to access (or continue to access) the default pointer in directory 101, and at step 214 controller 122 again loads the default configuration 103 into the PLD(s). The process cycles back to step 204 where another attempt is made to store alternative data in memory 100. The system can retry the update procedure until successful. Thus, a fail-safe method of updating configuration data is achieved, and it does not require an uninterruptible power supply or other cumbersome steps or equipment to assure that the system can be safely and successfully updated.

Figure 3:
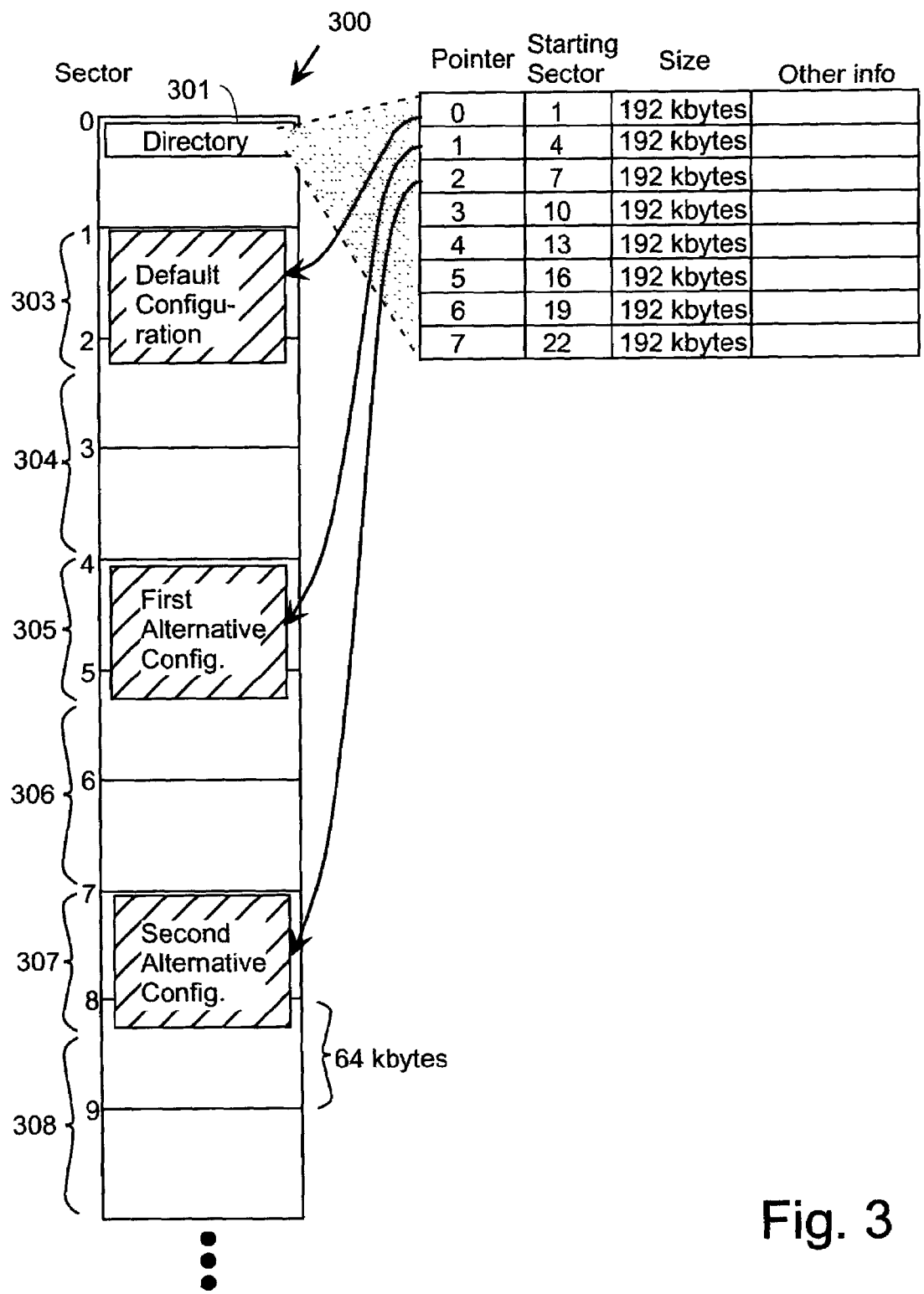
FIG. 3 shows another memory structure according to the invention that accommodates increased configuration data stream capacity.

FIG. 3 shows an alternative embodiment that allows for a larger configuration data bitstream to be stored in memory 300 in the event that a PLD will actually be removed from the system and replaced by a PLD (one or more) that uses a larger configuration data bitstream. While default configuration data 303, 305, 307, etc. each require only 75 kilobytes of data to configure an existing PLD in the system, directory 301 allocates 192 kilobytes of configuration data for this purpose, thereby allocating some padding in memory regions 304, 306, 308, etc., so that if in the future a PLD is replaced by a larger PLD, or a single PLD is replaced by more than one PLD, the alternative configuration data 305, 307, etc. can be replaced by new configuration data having a larger size without requiring any change in directory 301. This embodiment does require additional space in memory 300 as can be seen by noting that more sectors have been used for the same number of configuration data streams.

Figure 4:
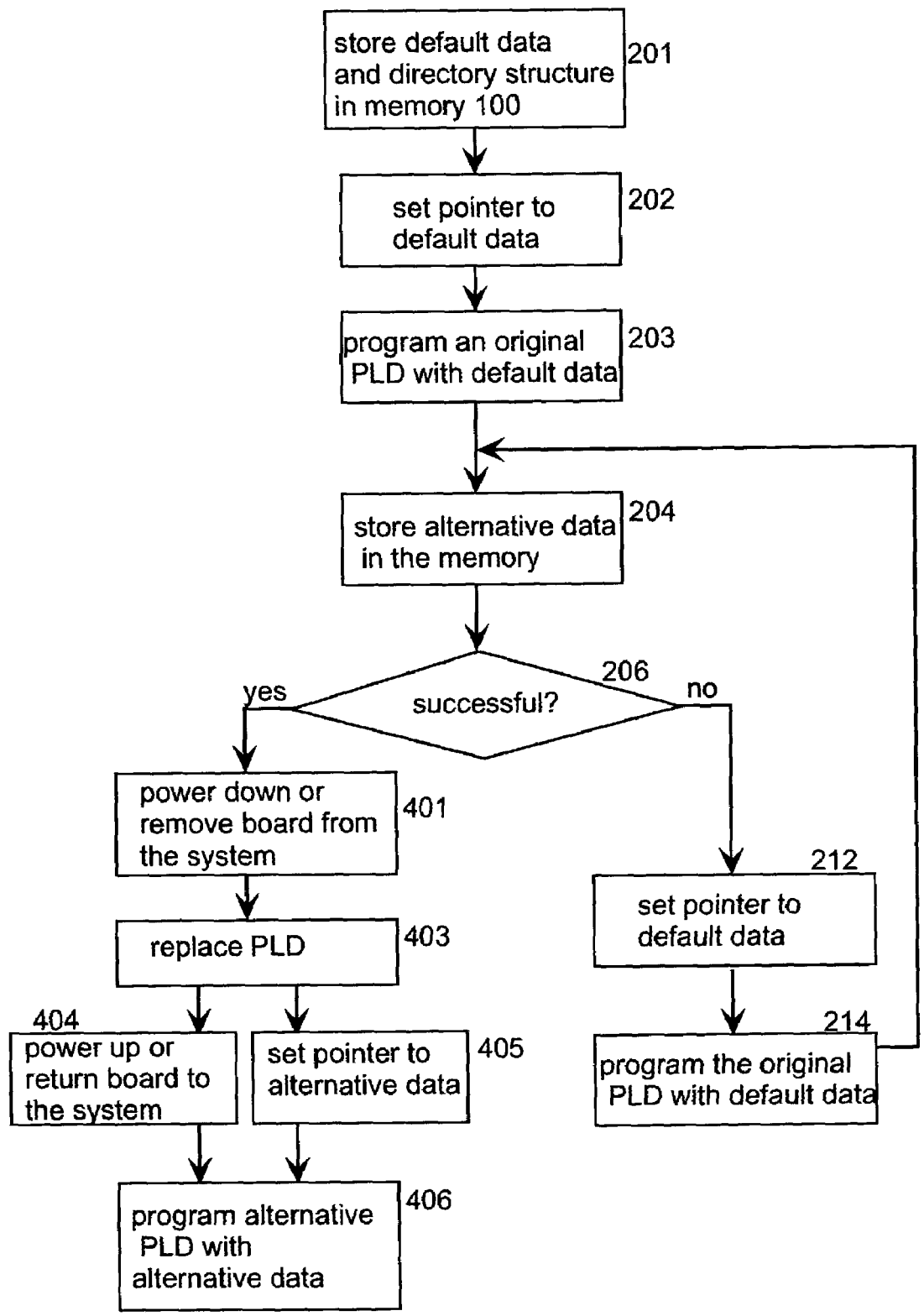
FIG. 4 shows a process for updating a system including updating a memory structure and updating system hardware.

FIG. 4 shows the steps performed when changing a PLD in an operational system. (Steps that are the same as in FIG. 2 are given the same reference numerals and not explained again.) Before a PLD can be replaced, the new configuration data for configuring the new PLD must be stored in memory 300 using the old PLD during the memory write process. Steps 201 through 206, 212 and 214 are performed before replacing the PLD. Step 204, however, stores alternative data for the new PLD that is not yet in the system.

When step 206 indicates that this configuration data for the new PLD has been successfully stored in the system, the process moves to step 401, at which time the system is powered down or a board containing the PLD is removed from the system. At step 403, while the system is powered down or the board removed, the old PLD is replaced by the new PLD. Two additional steps 404 and 405 are performed next and the order depends upon details of the system.

If the system uses a microcontroller to select a directory entry which in turn selects the configuration data to be loaded into the new PLD, step 404 may occur next, and the system is powered up or the board containing the replaced PLD(s) is returned to the powered up system. (Removing a board or chip from a powered up system and replacing it while the system is powered up is called hot swapping.) This is followed at step 405 by the microcontroller addressing directory 301 to cause directory 301 to select the new configuration data for the new PLD, and step 406 by programming the new PLD with the alternative data.

If a jumper is manually set to cause directory 301 to select the new configuration data, step 405 occurs while the system is still powered down, after which, at step 404, the system is powered up or the board replaced, and at step 406, the new PLD is programmed with the alternative configuration data.

The structure and method of FIGS. 3 and 4 is fail-safe because the original PLD is not replaced until new configuration data is successfully stored for configuring the new PLD. Thus, it is assured that after the original PLD has been replaced and the system again powered up, the new PLD can be successfully configured and the system again made operational with new functions or new features.

Figure 5:
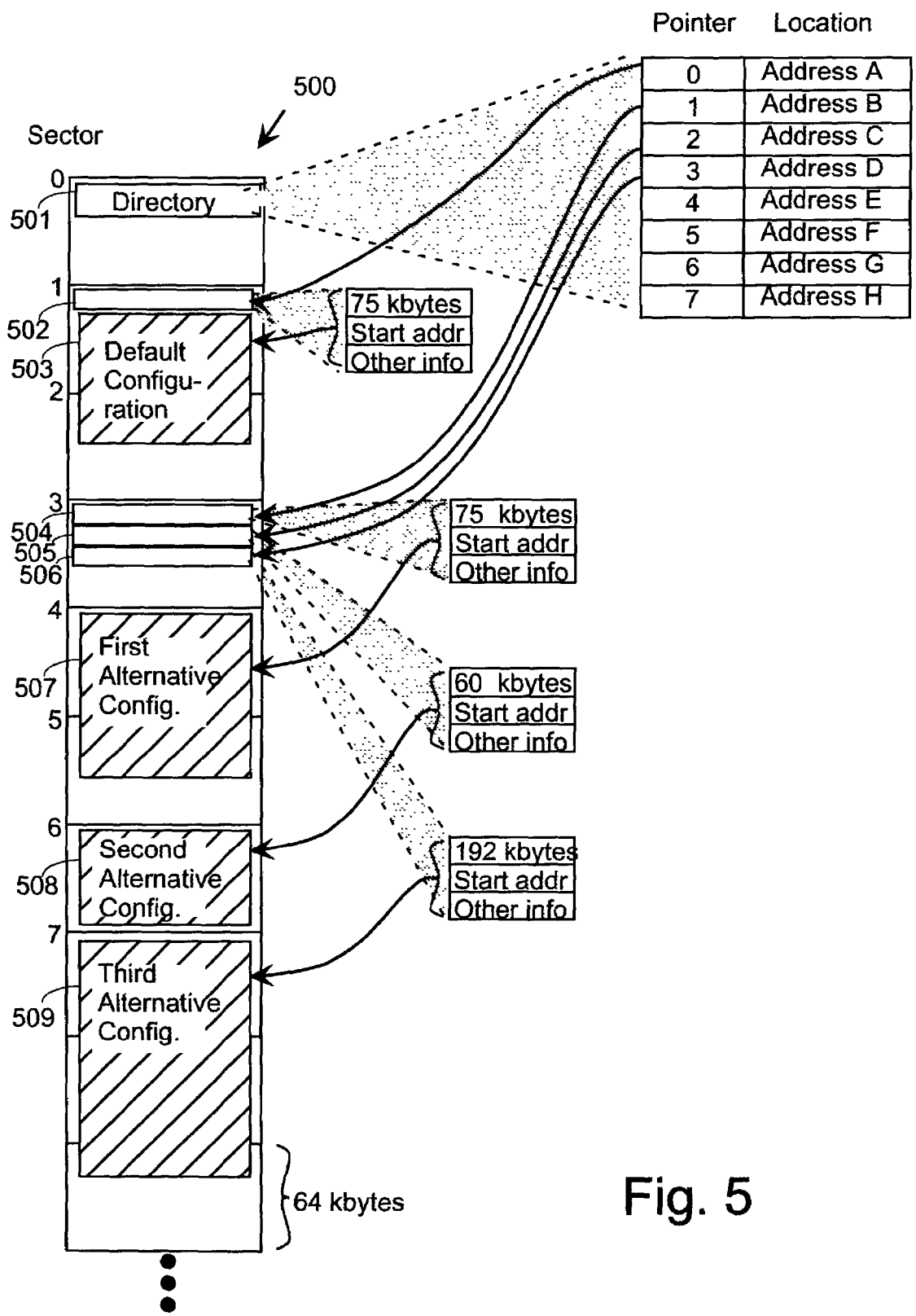
FIG. 5 shows another memory structure according to the invention that allows for flexible system updates.

FIG. 5 shows yet another embodiment that allows for further fail-safe change in an existing system. The embodiment of FIG. 5 allows for unexpected expansion or contraction of the amount of configuration data without requiring a large amount of padding in memory 500 and without leaving the system in an unstable state or unrecoverable state.

In the embodiment of FIG. 5, directory 501 includes only minimal information: pointer numbers and associated addresses. Information on size and start address are stored elsewhere, preferably in separate sectors of memory 500. For the system to access default configuration 503, it addresses pointer 0, which in turn supplies Address A, which in the example shown points to information block 502 in the same sector as default configuration 503. The system can set sectors 0, 1, and 2 occupied by directory 501, the information block 502 addressed by A, and the default configuration data 503 to the protected state. Information in block 502 specifies that the default configuration requires 75 kilobytes, and specifies the starting address. Information blocks 504, 505, and 506 (as well as others not shown) also specify sizes and starting addresses. The other information that may be stored in information blocks 504, 505, 506, etc. may specify whether the configuration data is encrypted or compressed, for example.

Information blocks for alternative configurations and the alternative configuration data are stored in different sectors from the directory 501, information block 502, and default configuration 503. Thus, the sizes, starting addresses, and configuration data of the alternative configurations can be changed without affecting any of the protected data, so that sizes, locations, and data of alternative configurations can all be changed and yet any failure in updating alternative configuration data does not place the system into an unstable state.

The advantage to having the information blocks 504, 505, 506, etc. separate from the main directory is that if a configuration data stream size is changed, the change can be made to the sector containing the information block for the new configuration data stream, and not to the protected directory entry. It is useful in the case of some memories that rewrite a minimum of a sector that the protected (default) information be stored in separate sectors from the alternative data, so there will be no chance of writing in the protected area and having a failure occur during the writing process. For example, if the memory update operation was interrupted while modifying the information in information block 505, then the data in sector 3 is corrupted. However, the system can be restarted using the protected data in sectors 0, 1, and 2, and thus the updating process is fail-safe. The arrangement of FIG. 5 accomplishes this fail-safe result of updating even information that was stored in directories 101 and 301.

Note that memory 500 has been configured to store several different sizes of configuration data. In the example, the alternative configurations 507, 508, and 509 require different numbers of sectors. This allows a variety of PLDs with a variety of configuration bitstream sizes to be stored in memory 500 in anticipation of modifying the system that includes memory 500. Yet memory 500 need not include padding in order to anticipate future growth, since size information in information blocks 504, 505, and 506 may be changed without threatening the fail-safe operation of the system.

In light of the several embodiments discussed above, further embodiments will become obvious to those skilled in the art, and these additional embodiments are intended to fall within the scope of the present invention. For example, although FIGS. 1, 3, and 5 show embodiments in which a directory stores eight simultaneous configuration pointers, other numbers of configuration pointers and related configuration information may be stored, up to the capacity of the memory to hold the configuration and directory information. Also, although the figures show a memory map with contiguous sectors for storing information, there is no reason the storage needs to be contiguously arranged. Configuration information may be interspersed with other information. And although the above discussion refers primarily to a single PLD, the invention may be used for any number of PLDs as long as the memory storage space is sufficient to store the information. In particular, a memory may include several of the memory structures shown for configuring a corresponding several PLDS. The PLDs may comprise a mixture of FPGAs, CPLDs, and other programmable structures. Further, even though the examples show a default configuration and refer to this default configuration as the one re-loaded in the event of a failure, it is possible to change which configuration is the default configuration after several configurations have been stored, and to make use of an alternative default configuration in the event of a future failure. Along with this change, if the memory can include protected sectors, sectors storing a new default configuration would likely be marked as protected sectors and other sectors released from protection. Further, whereas the above discussion refers to a hot swapping process in which a board is removed from a system, a PLD is replaced in the board, and the board is returned to the system, it is also possible to remove a board from the system and replace it with another board.

What is claimed is:

1. A reconfigurable system comprising:
   a computer readable memory divided into sectors and including a directory, wherein the directory includes a plurality of pointers that reference the sectors, respectively;
   a programmable logic device (PLD);
   a structure for identifying a default pointer in the directory; and
   a circuit for programming the PLD with data from a part of the memory identified by the default pointer;
   wherein the circuit is configured to program the PLD with the data from the part of the memory identified by the default pointer if an error occurs when storing an alternative configuration in the memory.

2. The system of claim 1 wherein the structure for identifying the default pointer is a jumper manually movable by a user.

3. The system of claim 1 wherein the circuit for programming the PLD with data from a part of the memory identified by the default pointer is further able to program the PLD with data from a part of the memory not identified by the default pointer.

4. The system of claim 1 wherein the structure for identifying the default pointer is a controller.

5. The system of claim 1 wherein the structure for identifying the default pointer is a microprocessor.

6. The system of claim 1, wherein the sectors of the computer readable memory comprise:
   at least one default sector for storing a default programmable logic device (PLD) configuration;
   at least one alternative sector for storing an alternative PLD configuration;
   a directory sector storing the directory.

7. The system of claim 6, wherein the default PLD configuration is stored in more than one default sector.

8. The system of claim 7, wherein the alternative PLD configuration is stored in more than one alternative sector and occupies as much of the memory as does the default PLD configuration.

9. The system of claim 6, wherein the alternative PLD configuration occupies an amount of memory different from an amount of memory occupied by the default PLD configuration.

10. The system of claim 6, wherein the at least one alternative sector comprises a plurality of alternative sectors.

11. The system of claim 6, wherein the pointers each point to a starting address for a configuration.

12. The system of claim 11, wherein the starting addresses are separated from each other by an amount greater than the memory required for the default configuration.

13. A method for programming a programmable logic device (PLD) comprising:
   storing a directory in a memory, the directory including a plurality of pointers that reference a plurality of sectors of the memory, respectively;
   storing default data in a first sector, the first sector being any of the plurality of sectors of the memory;
   setting a first one of the pointers in the directory to reference the default data in the first sector;
   programming the PLD with the default data referenced by the first one of the pointers;
   storing alternative data in a second sector, the second sector being any of the sectors other than the first sector of the memory;
   if storing the alternative data was successful,
      setting a second one of the pointers in the directory to point to the alternative data in the second sector; and
      programming the PLD with the alternative data referenced by the second one of the pointers;
   if storing the alternative data was not successful, programming the PLD with the default data referenced by the first one of the pointers.

14. The method of claim 13, further comprising reading one of the pointers from the directory in response to an address provided by a device external to the memory; and
   using the one of the pointers to reference data for programming the PLD.

15. A computer memory structure comprising:
   at least one region of memory for storing a default PLD configuration;
   at least one alternative region of memory for storing an alternative PLD configuration;
   a region of memory storing a directory;
   at least one region of memory storing a plurality of information blocks;
   wherein the directory comprises a plurality of pointers to a corresponding plurality of information blocks and each of the information blocks points to one of the regions of memory for storing a PLD configuration;
   wherein the at least one region of memory storing a plurality of information blocks comprises at least two regions of memory, one of which stores a default information block and one of which stores alternative information blocks; and
   wherein the region of memory storing a directory, the region of memory for storing a default PLD configuration, and the region of memory which stores a default information block are protected from being overwritten.

16. The computer memory structure of claim 15 wherein the default and alternative information blocks store information on size and starting address for corresponding PLD configurations.

17. The computer memory structure of claim 16 wherein the information blocks further store additional information on the corresponding PLD configurations.

18. A method of updating an electronic system having an original programmable logic device (PLD) and a memory, the method comprising:
   storing an alternative PLD configuration for an alternative PLD in the memory;
   confirming that the alternative PLD configuration was stored correctly;
   replacing the original PLD with an alternative PLD; and
   configuring the alternative PLD with the alternative PLD configuration;
   wherein replacing the original PLD with an alternative PLD comprises:
      removing the original PLD from the system; and
      placing an alternative PLD in a position occupied by the original PLD in the system; and
   wherein confirming that the alternative PLD configuration was stored correctly comprises:
      if the alternative PLD configuration was stored correctly, indicating that the alternative PLD configuration was stored correctly;
      if the alternative PLD configuration was not stored correctly,
         assuring that the default configuration is loaded into the old PLD, and
         again storing the alternative PLD configuration in the memory; and
      repeating the steps of indicating assuring and again storing until the alternative PLD configuration is stored correctly.

19. The method of claim 18 wherein the step of confirming that the alternative PLD configuration was stored correctly comprises:
   recognizing that the alternative PLD configuration was not stored correctly;
   restoring an original PLD configuration to the original PLD; and
   repeating the step of storing an alternative PLD configuration.

20. The method of claim 18 wherein replacing the original PLD with an alternative PLD comprises:
   powering down the system;
   while the system is without power, removing the original PLD and inserting the alternative PLD; and
   powering up the system.

21. The method of claim 18 wherein replacing the original PLD with an alternative PLD comprises:
   removing a board including the original PLD from the system; and
   replacing the board in the system.

22. The method of claim 21 wherein the steps of removing a board including the original PLD from the system and replacing the board in the system are separated by replacing a PLD on the board.

23. The method of claim 21 wherein the steps of removing a board including the original PLD from the system and replacing the board in the system are separated by substituting another board for the board.

24. The method of claim 18 wherein configuring the alternative PLD with the alternative PLD configuration comprises addressing a directory in the memory to select a pointer to the alternative PLD configuration.

* * * * *